United States Patent
Kato

(10) Patent No.: US 10,026,036 B2
(45) Date of Patent: Jul. 17, 2018

(54) WIRELESS COMMUNICATION DEVICE AND WIRELESS COMMUNICATION MODULE MANUFACTURING METHOD

(71) Applicant: Murata Manufacturing Co., Ltd., Nagaokakyo-shi, Kyoto-fu (JP)

(72) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 128 days.

(21) Appl. No.: 15/212,480

(22) Filed: Jul. 18, 2016

(65) Prior Publication Data
US 2016/0328640 A1    Nov. 10, 2016

Related U.S. Application Data

(63) Continuation of application No. PCT/JP2015/052655, filed on Jan. 30, 2015.

(30) Foreign Application Priority Data

Jan. 30, 2014    (JP) ................................ 2014-015483

(51) Int. Cl.
*H01Q 1/22*    (2006.01)
*G06K 19/077*    (2006.01)
(Continued)

(52) U.S. Cl.
CPC . *G06K 19/07775* (2013.01); *G06K 19/07722* (2013.01); *G06K 19/07749* (2013.01);
(Continued)

(58) Field of Classification Search
CPC ........................... H01Q 1/2225; H01Q 1/2283
See application file for complete search history.

(56) References Cited

U.S. PATENT DOCUMENTS 8,757,500 B2 *    6/2014    Kato ................ G06K 19/07749
                                                                235/492
2005/0181750 A1    8/2005    Pinks
(Continued)

FOREIGN PATENT DOCUMENTS

JP            2628214 B2      7/1997
JP        2004-343337 A      12/2004
(Continued)

OTHER PUBLICATIONS

English translation of Official Communication issued in corresponding International Application PCT/JP2015/052655, dated Apr. 21, 2015.

*Primary Examiner* — Hoang Nguyen
*Assistant Examiner* — Awat Salih
(74) *Attorney, Agent, or Firm* — Keating & Bennett, LLP

(57) ABSTRACT

In a wireless communication device, an impedance matching circuit includes a first layered coil conductor one end of which is connected to a first I/O terminal, the first layered coil conductor includes loop conductors including a plurality of layers, and a second layered coil conductor one end of which is connected to the other end of the first layered coil conductor and the other end of which is respectively connected to a second I/O terminal, the second layered coil conductor includes loop conductors including a plurality of layers. On the surface of the wireless communication device, first and second terminal electrodes are connected via first and second in-plane conductors and first and second interlayer conductors to any of the loop conductors of the first and second layered coil conductors. Connection locations of the first and second in-plane conductors to the first and second layered conductors determine the antenna element-side impedance seen by the first and second I/O terminals of the wireless IC chip.

5 Claims, 13 Drawing Sheets

(51) Int. Cl.
    *H01Q 9/16*          (2006.01)
    *H01Q 5/335*        (2015.01)
    *H01Q 9/04*          (2006.01)
    *H01Q 9/28*          (2006.01)

(52) U.S. Cl.
    CPC ........... *H01Q 1/2283* (2013.01); *H01Q 5/335* (2015.01); *H01Q 9/0414* (2013.01); *H01Q 9/16* (2013.01); *H01Q 9/285* (2013.01); *H01L 2224/16225* (2013.01); *H01L 2224/32225* (2013.01); *H01L 2224/73204* (2013.01); *H01Q 1/2225* (2013.01)

(56) References Cited

U.S. PATENT DOCUMENTS

| | | | |
|---|---|---|---|
| 2009/0160719 A1* | 6/2009 | Kato | G06K 19/07749 343/742 |
| 2009/0262041 A1 | 10/2009 | Ikemoto et al. | |
| 2011/0278362 A1* | 11/2011 | Dokai | G06K 19/07749 235/492 |
| 2011/0279326 A1* | 11/2011 | Dokai | H01Q 1/2225 343/700 MS |
| 2012/0153029 A1* | 6/2012 | Kato | G06K 19/07749 235/492 |

FOREIGN PATENT DOCUMENTS

| | | |
|---|---|---|
| JP | 4561932 B2 | 10/2010 |
| WO | 2009/081719 A1 | 7/2009 |

* cited by examiner

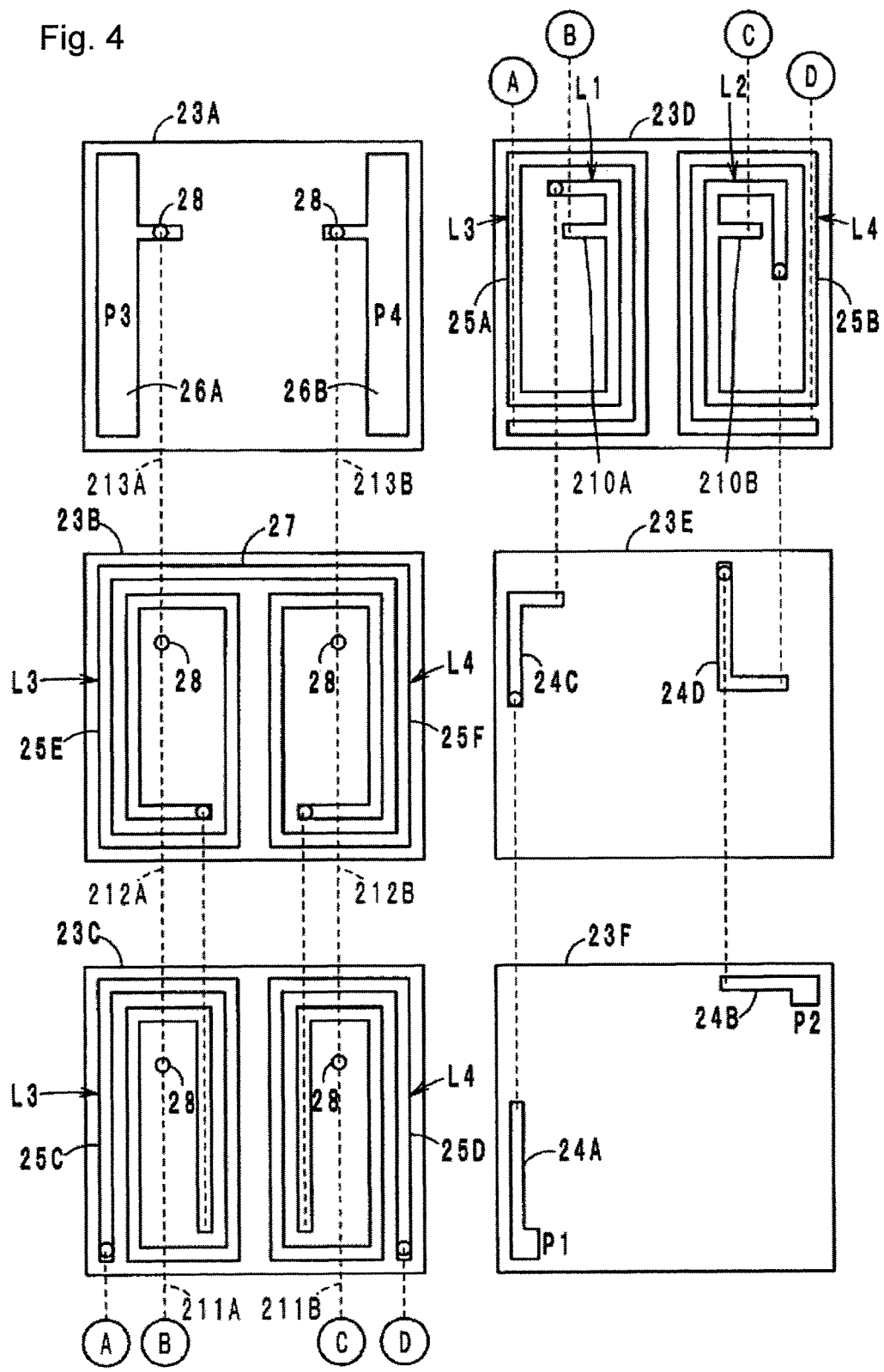

FIRST PATTERN EXAMPLE
(ABOUT 1000Ω)

| | Freq (MHz) | Ang | Mag | RX |
|---|---|---|---|---|
| M1 | 0.8600 | 57.6949 | 0.8080 | 0.4399+ 1.7306i |
| M2 | 0.9200 | 48.9487 | 0.8056 | 0.5940+ 2.0564i |
| M3 | 0.9000 | 51.8600 | 0.8062 | 0.5350+ 1.9386i |

THIRD PATTERN EXAMPLE
(ABOUT 15Ω)

| | Freq (MHz) | Ang | Mag | RX |
|---|---|---|---|---|
| M1 | 0.8600 | 144.6074 | 0.8617 | 0.0818+ 0.3171i |
| M2 | 0.9200 | 139.5917 | 0.8352 | 0.1018+ 0.3646i |
| M3 | 0.9000 | 141.3712 | 0.8449 | 0.0943+ 0.3477i |

SECOND PATTERN EXAMPLE
(ABOUT 25Ω)

| | Freq (MHz) | Ang | Mag | RX |
|---|---|---|---|---|
| M1 | 0.8600 | 132.7121 | 0.8322 | 0.1090+ 0.4334i |
| M2 | 0.9200 | 126.3113 | 0.8034 | 0.1366+ 0.4986i |
| M3 | 0.9000 | 128.5710 | 0.8138 | 0.1262+ 0.4753i |

SECOND PATTERN EXAMPLE
(ABOUT 75Ω)

| | Freq (MHz) | Ang | Mag | RX |
|---|---|---|---|---|
| M1 | 0.8600 | 71.4853 | 0.7905 | 0.3342+ 1.3351i |
| M2 | 0.9200 | 61.9452 | 0.7816 | 0.4444+ 1.5753i |
| M3 | 0.9000 | 66.1608 | 0.7844 | 0.4024+ 1.4887i |

WIRELESS COMMUNICATION DEVICE AND WIRELESS COMMUNICATION MODULE MANUFACTURING METHOD

CROSS REFERENCE TO RELATED APPLICATIONS

This application claims the benefit of priority to Japanese Patent Application 2014-015483 filed Jan. 30, 2014 and is a Continuation Application of PCT/JP2015/052655 filed on Jan. 30, 2015. The entire contents of each application are hereby incorporated herein by reference.

BACKGROUND OF THE INVENTION

1. Field of the Invention

The present invention relates to a wireless communication device, especially, a wireless communication device used in an RFID (Radio Frequency Identification) system, and a manufacturing method of a wireless communication module defining the wireless communication device.

2. Description of the Related Art

An RFID system as a management system for articles has recently been developed according to which communication is executed in a non-contact manner between a reader/writer that generates an induction electromagnetic field and an IC tag that has predetermined information stored therein (hereinafter, referred to as "wireless communication device") attached to an article to transmit information. The wireless communication device used in the RFID system uses an antenna having any one of various shapes depending on the use thereof. When the shape of the antenna is changed, the value of the impedance of the antenna for the wireless IC chip is also varied and an impedance matching circuit has to be designed depending on the shape of the antenna.

In an ordinary wireless communication device, an impedance matching circuit is disposed on a base material film that has an antenna element disposed therein. The impedance matching circuit is fabricated by mounting chip parts such as an inductor and a capacitor each having a proper element value, or forming as a pattern an inductor, a capacitor, and the like each having a proper element value on the base material film.

The wireless communication device is attached to each of various articles and is used in each of various use environments. When the impedance matching circuit is fabricated on the same base material film as that of the antenna element, the impedance matching circuit is influenced depending on the type of the article (especially, the relative permittivity thereof) and the use environment. As a result, a defect arises that the value of the impedance is shifted and the loss is increased (the communication distance is shortened).

An approach according to which an impedance matching circuit is incorporated in a multi-layer substrate other than a film that has an antenna disposed thereon, and the multi-layer substrate is mounted on the antenna is described in Japanese Patent No. 4561932. With this approach, the impedance matching circuit surely tends to avoid any influence of the external environment. The antenna however can take any of various shapes and plural multi-layer substrates need to be prepared depending on the shape of the antenna, that is, the number of line-ups of the multi-layer substrate needs to be increased resulting in an increase of the labor for designing the multi-layer substrate and the labor for stock management.

Especially, when the impedance matching circuit is configured using a rewiring layer of the wireless IC chip, the wireless IC chip cannot be used for any other use and the degree of difficulty is therefore increased for the production management and the stock management.

SUMMARY OF THE INVENTION

Preferred embodiments of the present invention provide diversified wireless communication devices each having a value of impedance different from that of each other to be able to cope with various types of antennas. Preferred embodiments of the present invention also provide a manufacturing method that enables efficient manufacture of many types of wireless communication module having a different impedance value, that can cope with various types of antenna.

A wireless communication device according to a first aspect of a preferred embodiment of the present invention is a wireless communication device including a wireless communication module that includes a wireless IC chip including first and second input/output terminals and processing an RF signal of a UHF band, and an impedance matching circuit connected to the first and the second input/output terminals; and an antenna base material having the wireless communication module mounted thereon and having an antenna element disposed thereon, wherein the impedance matching circuit includes a first multi-layer coil electric conductor having one end thereof connected to the first input/output terminal and including plural loop electric conductors provided in a plurality of layers; and a second multi-layer coil electric conductor having one end thereof connected to another end of the first multi-layer coil electric conductor and another end thereof connected to the second input/output terminal and including a plurality of loop electric conductors provided in a plurality of layers, wherein a surface of the wireless communication module includes a first terminal electrode disposed thereon that is connected to any one of the plurality of loop electric conductors of the first multi-layer coil electric conductor through a first in-plane electric conductor and a first interlayer electric conductor, and a second terminal electrode disposed thereon that is connected to any one of the plural loop electric conductors of the second multi-layer coil electric conductor through a second in-plane electric conductor and a second interlayer electric conductor, and wherein a value of impedance of the antenna element for the first and the second input/output terminals of the wireless IC chip is determined by selecting a connection position of the first in-plane electric conductor to the first multi-layer coil electric conductor and a connection position of the second in-plane electric conductor to the second multi-layer coil electric conductor.

In the wireless communication device, the impedance matching circuit is disposed on a rewiring layer or a multi-layer substrate that is disposed on a principal surface of the wireless IC chip. In this case, the value of the impedance of the antenna element is set by selecting the positions at which the terminal electrodes are each connected to any one of the plurality of loop electric conductors through the interlayer electric conductor. The wireless communication device having plural impedance values is able to be acquired by selecting the connection positions connecting to the terminal electrodes of the multi-layer coil electric conductor having a basically same form. The impedance property tends to avoid any influence of the external environment because the impedance matching circuit is disposed in the rewiring layer or the multi-layer substrate.

A manufacturing method of a wireless communication module according to a second aspect of preferred embodiments of the present invention is a manufacturing method of a wireless communication module, wherein the wireless communication module thereof includes a wireless IC chip including first and second input/output terminals and processing an RF signal of a UHF band, and an impedance matching circuit connected to the first and the second input/output terminals, wherein the impedance matching circuit includes a first multi-layer coil electric conductor having one end thereof connected to the first input/output terminal and including plural loop electric conductors provided in a plurality of layers; and a second multi-layer coil electric conductor having one end thereof connected to another end of the first multi-layer coil electric conductor and another end thereof connected to the second input/output terminal and including a plurality of loop electric conductors provided in a plurality of layers, wherein a surface of the wireless communication module includes a first terminal electrode disposed thereon that is connected to any one of the plural loop electric conductors of the first multi-layer coil electric conductor through a first in-plane electric conductor and a first interlayer electric conductor, and a second terminal electrode disposed thereon that is connected to any one of the plural loop electric conductors of the second multi-layer coil electric conductor through a second in-plane electric conductor and a second interlayer electric conductor, and wherein the manufacturing method includes disposing in one wafer plural types of wireless communication module each including a connection position between the terminal electrode and the loop electric conductor, each connection position being different from each other.

According to the manufacturing method, the plural types of wireless communication module each having a connection position different from that of each other for the terminal electrode and any one of the plural loop electric conductors are disposed in one wafer. The manufacturing method is suitable for manufacturing of diversified products in small quantities. Because the multi-layer coil electric conductors having the basically same structure are disposed in one wafer, the rewiring layer and the like each have an equal or substantially equal electric conductor density for even those each having the connection position different from that of each other. The wafer therefore tends to avoid warpage and undulation, and efficient manufacturing is enabled.

A wireless communication device that according to a third aspect of a preferred embodiment of the present invention is a wireless communication device including a wireless communication module that includes a wireless IC chip including first and second input/output terminals and processing an RF signal of a UHF band, and an impedance matching circuit connected to the first and the second input/output terminals; and an antenna base material having the wireless communication module mounted thereon and including an antenna element disposed thereon, wherein the impedance matching circuit includes a first multi-layer coil electric conductor having one end thereof connected to the first input/output terminal and including plural loop electric conductors provided in a plurality of layers; and a second multi-layer coil electric conductor having one end thereof connected to another end of the first multi-layer coil electric conductor and another end thereof connected to the second input/output terminal and including a plurality of loop electric conductors provided in a plurality layers, wherein a surface of the wireless communication module includes a first terminal electrode disposed thereon that is connected to any one of the plural loop electric conductors of the first multi-layer coil electric conductor through a first in-plane electric conductor and a first interlayer electric conductor, and a second terminal electrode disposed thereon that is connected to any one of the plural loop electric conductors of the second multi-layer coil electric conductor through a second in-plane electric conductor and a second interlayer electric conductor, and wherein the first and the second in-plane electric conductors are respectively connected to the first and the second multi-layer coil electric conductors at positions located within the first and the second multi-layer coil electric conductors.

According to various preferred embodiments of the present invention, diversified wireless communication devices that each have impedance whose value is different from that of each other and that is able to cope with various antennas, is efficiently acquired.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a view for explaining a first pattern example for each rewiring layer.

DETAILED DESCRIPTION OF THE PREFERRED EMBODIMENTS

Figure 1:
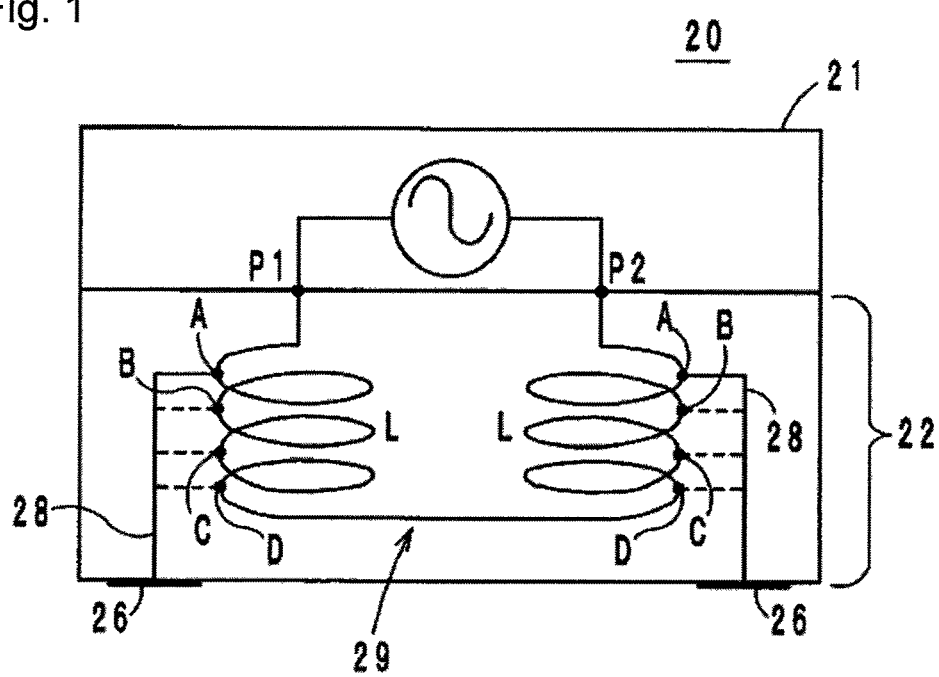
FIG. 1 is a view for explaining a basic form of a preferred embodiment of the present invention.

Preferred embodiments of a wireless communication device and a manufacturing method of a wireless communication module according to the present invention will be described below with reference to the accompanying drawings. Common elements and common portions in the preferred embodiments described below are given the same reference numerals and will not again be described.

A basic form of a preferred embodiment of the present invention will be described with reference to FIG. 1. In FIG. 1, a wireless communication module 20 includes a wireless IC chip 21 that processes a radio frequency (RF) signal of a UHF band, and a rewiring layer 22 that is disposed on a principal surface of the wireless IC chip 21 and that includes an impedance matching circuit 29 connected to the wireless IC chip 21 (at connection portions P1 and P2). The impedance matching circuit 29 includes at least one multi-layer coil electric conductor each including plural loop electric conductors provided in a plurality of layers (hereinafter, each described as "inductance element L"). The surface of the rewiring layer 22 includes terminal electrodes 26 disposed thereon that are each connected to any one of the plural loop electric conductors through an interlayer electric conductor 28. The value of the impedance of the antenna element is able to be varied by selecting connection positions A, B, C, and D between the terminal electrode 26 and the loop electric conductors.

Figure 2:
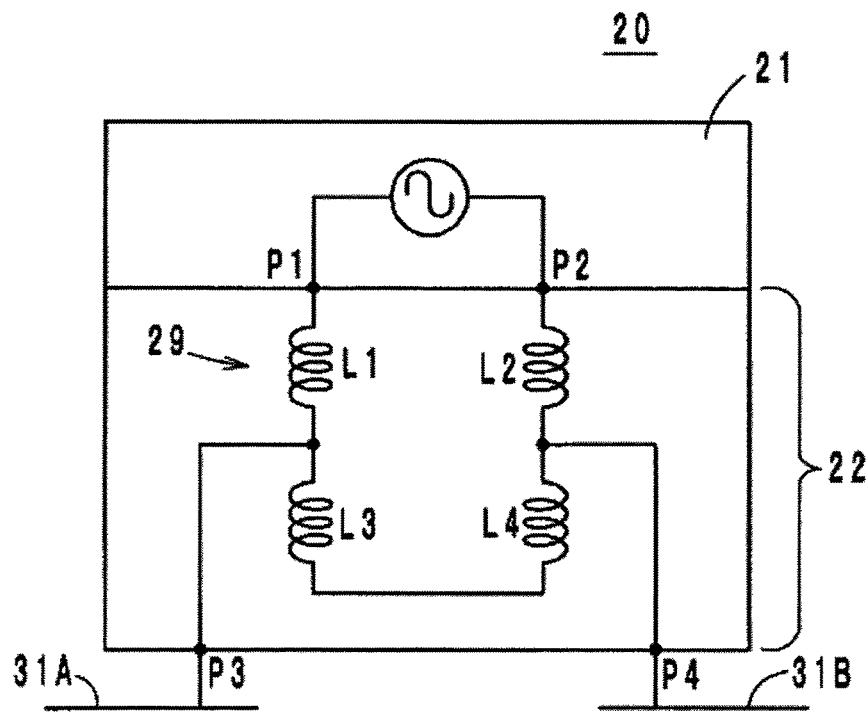
FIG. 2 is an equivalent circuit diagram of an impedance matching circuit.

For example, as depicted in FIG. 2, the wireless IC chip 21 is a semiconductor integrated circuit element to process an RFID signal in a UHF band, has necessary information stored therein, and is rewritable as to information stored therein. The impedance matching circuit 29 includes the inductance elements L1, L2, L3, and L4 that each have a coil shape and that are disposed adjacent to each other in a plan view. The inductance elements L1 and L2 are respectively connected in series to the inductance elements L3 and L4. The magnetic fields of the elements L1 and L2, and those of the elements L3 and L4 are in-phase with each other. The magnetic fields of the elements L1 and L3, and those of the elements L2 and L4 are in-phase with each other. An end of each of the inductance elements L1 and L2 is connected to an input/output terminal of the wireless IC chip 21 (at connection portions P1 and P2). The connection portion of the inductance elements L1 and L3, and the connection portion of the inductance elements L2 and L4 are respectively connected to ends of connection electrodes 31A and 31B through the terminal electrodes 26 (the connection portions P3 and P4). The connection electrodes 31A and 31B are connected to radiation electric conductors not depicted.

The wireless communication module 20 preferably is structured as an IC package and, for example, as a WL-CSP (Wafer Level Chip Size Package) and the thickness of the rewiring layer 22 is set to be a thickness of, for example, about 100 μm relative to the wireless IC chip 21 whose thickness is about 100 μm to about 150 μm. The rewiring layer 22 is typically fabricated using a thin film microfabrication process (etching and photolithography). An electric conductor pattern to dispose the inductance elements L1, L2, L3, and L4 in the rewiring layer 22 is formed using, for example, copper, and interlayer insulating layers (layers) are each formed using an organic substance such as polyimide or an inorganic substance such as $SiO_2$ and each have a thickness of about 5 μm to about 10 μm, for example.

A preferred example of an operation of the impedance matching circuit 29 will be described with reference to FIGS. 3A and 3B.

Prior to the description, a more detailed configuration of the impedance matching circuit 29 will be described. In the impedance matching circuit 29, the inductance elements L1 and L2 each have a shape that is symmetrical to that of each other and the inductance elements L3 and L4 each have a shape that is symmetrical to that of each other. The inductance elements L1 and L3 are wound in the same direction and the inductance elements L2 and L4 are wound in the same direction while the winding direction of the inductance elements L1 and L3 is opposite to the winding direction of the inductance elements L2 and L4.

The connection electrode 31A is connected to, for example, one 36A of the pair of radiation electric conductors that form a dipole antenna and the connection electrode 31B is connected to the other 36B of the radiation electric conductors. Representing the central frequency of the RF signal of the UHF band to be processed by the wireless IC chip 21 as "f0", the electric length of each of the radiation electric conductors 36A and 36B has a length that is shorter than λ0/4 by a predetermined length. "λ0" is a wavelength that corresponds to f0.

Figure 3A:
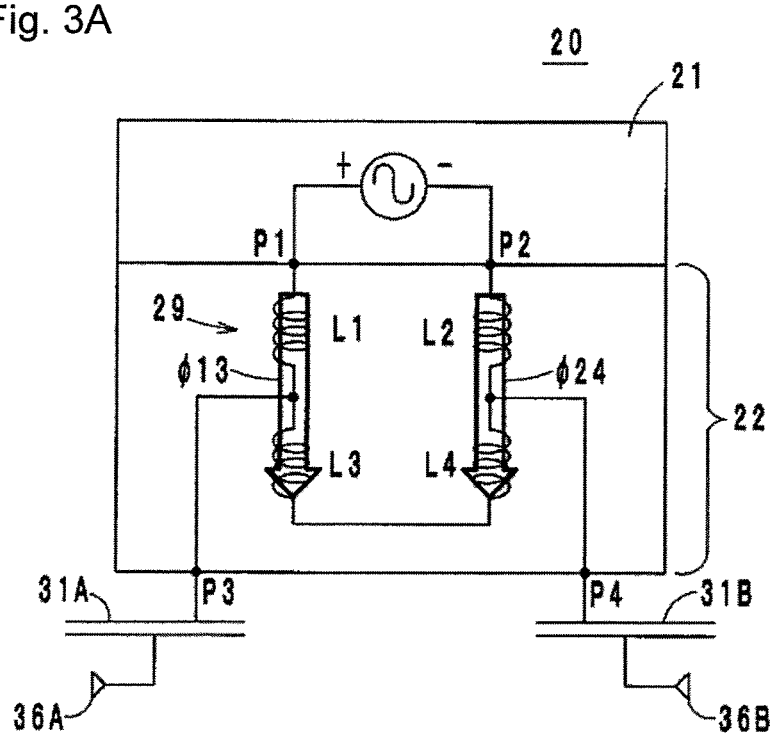
FIGS. 3A and 3B are schematic views for explaining an operation of the impedance matching circuit.

For example, as depicted in FIG. 3A, the wireless IC chip 21 outputs a positive phase signal (+) at the frequency f0 as the RF signal from the connection portion P1 and outputs an inverse phase signal (−) thereof from the connection portion P2. Floating capacitance and the like in the wireless IC chip 21 and the inductance elements L1 to L4 define a parallel resonance circuit whose resonance frequency is substantially f0. In this case, the potential at the connection position of the elements L1 and L3 and the potential at the connection position (that is, any one of the connection positions A to D) of the elements L2 and L4 each have a polarity opposite to that of each other and have an equal absolute value. The potentials of the radiation electric conductors 36A and 36B are therefore equal to the above potentials. An electric field is therefore generated between these and an electric wave is radiated. In this case, as depicted in FIG. 3A, a common magnetic flux Φ13 is generated in the inductance elements L1 and L3, and a common magnetic flux Φ24 is also generated in the inductance elements L2 and L4.

Figure 3B:
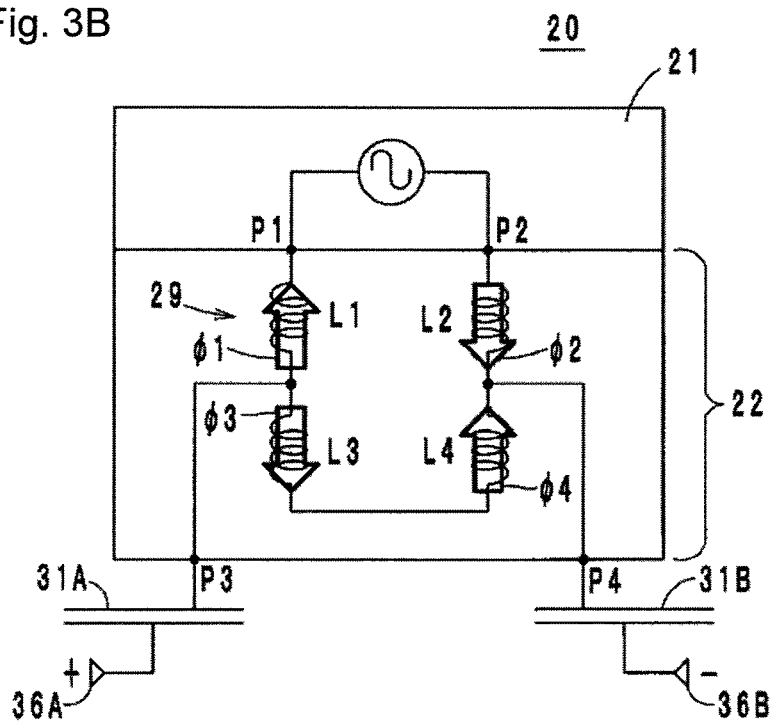

In contrast, as exemplified in FIG. 3B, at a frequency f1 with which a standing wave is generated at the connection terminals P3 and P4, a potential (+) is generated at the connection portion P3 and a potential (−) having an inverse phase of that of the potential (+) and having an absolute value equal to that thereof is generated at the connection portion P4. The elements L1 and L3 each have a current flowing therethrough in a direction opposite to that of each other and the directions of the magnetic fluxes Φ1 and Φ3 are opposite to each other. Similarly, an inverse phase current flows between the elements L2 and L4 and the directions of the magnetic fluxes Φ2 and Φ4 are also opposite to each other. The current intensity between the elements L3 and L4 is maximal and the magnetic fluxes Φ3 and Φ4 are generated in the same direction.

In this case, in addition to the elements L3 and L4, and the floating capacitance between the connection terminals P3 and P4, a reactance component of a series circuit of the elements magnetic-field-coupled with the elements L3 and L4, and the floating capacitance in the wireless IC chip (no series resonance is generated at the frequency f1 by the elements L1 and L2, and the floating capacitance in the wireless IC chip and these components seemingly act as a capacitance component) provide a capacitance component and a parallel resonance circuit is provided between the connection terminals P3 and P4. The resonance frequency of this parallel resonance circuit is f1 that is higher than f0. This is because the element L3 is magnetic-field-coupled with the element L1 and the element L4 is magnetic-field-coupled with the element L2, and the magnetic fields therefore cancel each other and L1, L2, L3, and L4 each has an inductance value that is smaller than that of the frequency f0. The frequency spacing between the resonance frequency f0 and the resonance frequency f1 can be widened by enhancing the magnetic-field-coupling between the elements L3 and L1, and the magnetic-field-coupling between the elements L2 and L4.

The inductance element value is varied depending on whether a mutual inductance M13 between L1 and L3 and a mutual inductance M24 between L2 and L4 vary to enhance the magnetic field or vary to weaken the magnetic field when the magnetic field coupling is established as depicted in FIGS. 3A and 3B. Compared to the difference in the frequency between the frequency f0 generated by the parallel resonance of the floating capacitance of the wireless IC chip and the elements L1+L2+l3+L4, and the resonance frequency f1 generated by the parallel resonance of the floating capacitance of the wireless IC chip and L1+L2 acquired when the elements L1 and L3, and L2 and L4 are not magnetic-field-coupled and when the magnetic field coupling is established, then, the difference between the resonance frequency f0 and the resonance frequency f1 when the magnetic field coupling is established becomes larger than the difference between the resonance frequency f0 and the resonance frequency f1 when the magnetic field coupling is not established. A wideband matching circuit is therefore provided.

The elements L1, L2, L3, and L4 are able to be provided each with an inductance value smaller than that of the case where no magnetic field coupling is present. This enables not only downsizing but also improvement of the Q-property of the inductance.

In FIGS. 3A and 3B, the element L3 and the element L4 have a structure that weakens the magnetic field coupling by separating the winding axes thereof from each other. This is to prevent significant variation of the electric length of the radiation electric conductor caused by the influence of the mutual inductances as a result of the fact that the connection terminals P3 and P4 are connected to the radiation electric conductors to be portions of the electric length of the radiation elements (the radiation property becomes maximal when the overall electric length is about λ/2). The radiation property of the radiation electric conductor and the property of the wideband matching element are thus able to be separated from each other.

As above, in the wireless communication module, a dual resonance circuit has two modes for different currents flowing therethrough at the frequencies f0 and f1, using the impedance matching circuit 29 and, therefore, the wireless communication module is able to be provided that does not significantly rely on the electric lengths of the radiation electric conductors 36A and 36B, that has a high radiation gain, and that is able to transmit and receive wideband RF signals. In other words, because the electric lengths of the radiation electric conductors 36A and 36B do not influence the communication distance when the wireless IC chip 21 and the impedance matching circuit 29 are used, the designing of the radiation electric conductors 36A and 36B is facilitated.

Figure 5:
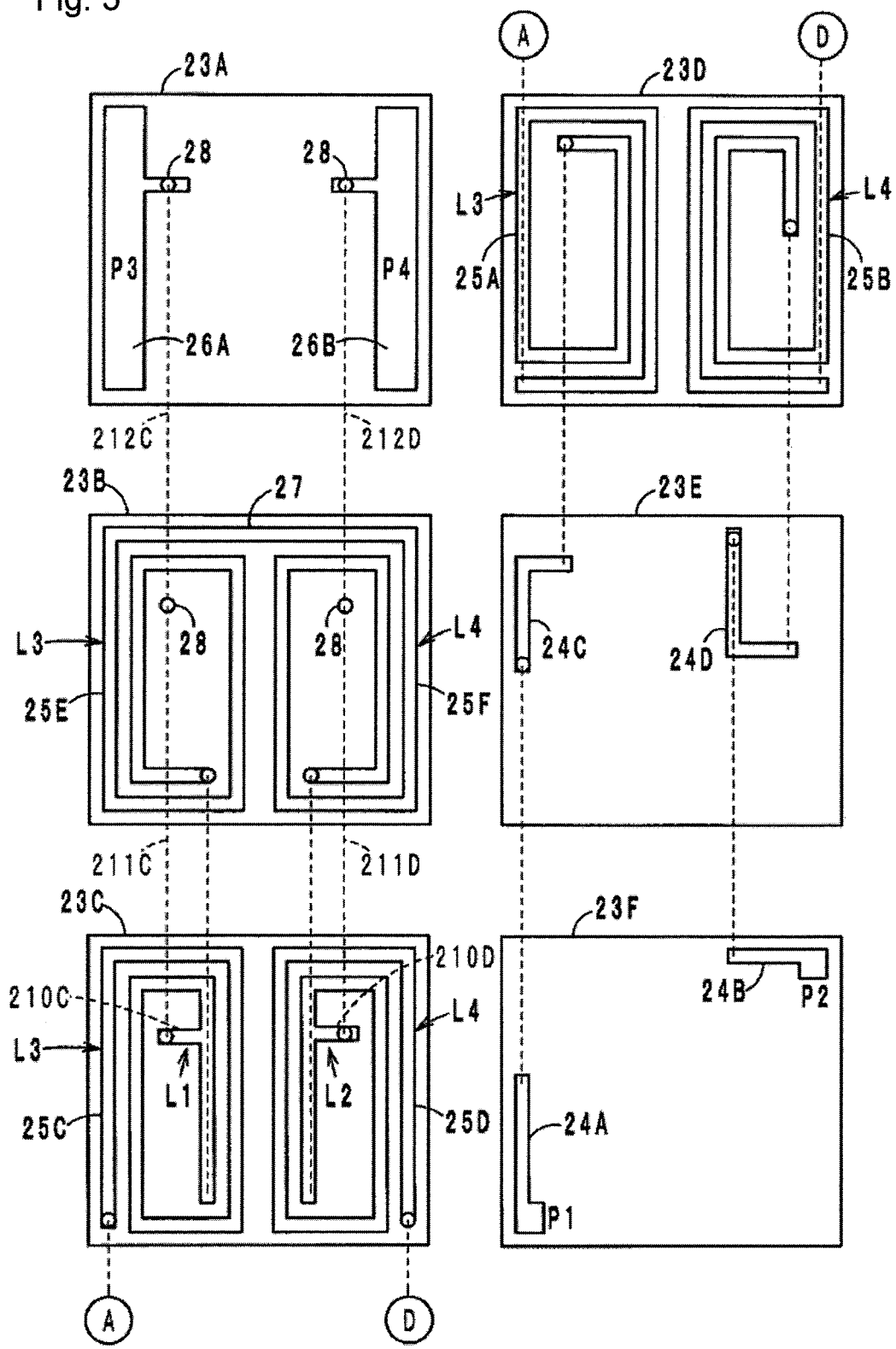
FIG. 5 is a view for explaining a second pattern example for each rewiring layer.
Figure 6:
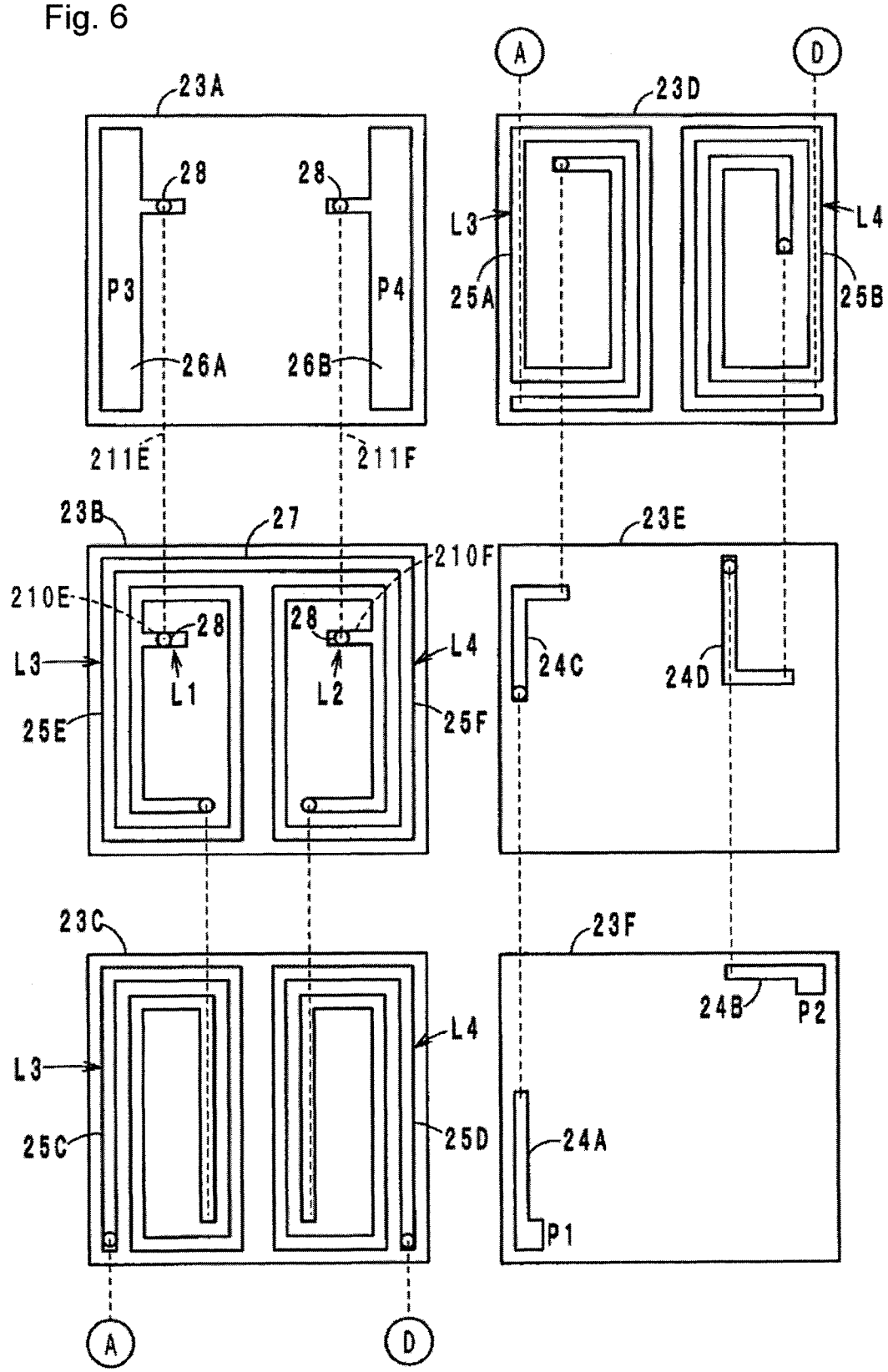
FIG. 6 is a view for explaining a third pattern example for each rewiring layer.

Though various pattern examples can be considered for the loop electric conductors disposed in the rewiring layer 22, a first pattern example is depicted in FIG. 4, a second pattern example is depicted in FIG. 5, and a third pattern example is depicted in FIG. 6 as the main examples. In these pattern examples, the rewiring layer 22 has in any one of the examples a multi-layer structure including a first layer 23A to a sixth layer 23F.

In the first pattern example depicted in FIG. 4, the sixth layer 23F including wiring electric conductors 24A and 24B is disposed on the surface of an active layer of the wireless IC chip 21, and the fifth layer 23E including wiring electric conductors 24C and 24D is disposed on the sixth layer 23F. The fourth layer 23D including loop electric conductors 25A and 25B that are adjacent on the right and the left to each other in a plan view, the third layer 23C including loop electric conductors 25C and 25D that are adjacent on the right and the left to each other in a plan view, and the second layer 23B including loop electric conductors 25E and 25F that are adjacent on the right and the left to each other in a plan view are further stacked in this order. One end of each of in-plane electric conductors 210A and 210B is connected respectively to the loop electric conductors 25A and 25B each at a position located therein. The in-plane electric conductors 210A and 210B are pulled out on the fourth layer 23D to be terminated. The other end of the in-plane electric conductor 210A is connected to the terminal electrode 26A through at least interlayer connection bodies 211A to 213A. Similarly, the in-plane electric conductor 210B is connected to the terminal electrode 26B through at least interlayer connection bodies 211B to 213B. In the loop electric conductors 25A and 25B, sections from the portions connected to the wiring electric conductors 24C and 24D to the portions connected to the in-plane electric conductors 210A and 210B respectively form the inductance elements L1 and L2. The rest of the loop electric conductor 25A and the loop electric conductors 25C and 25E form the inductance element L3, and the rest of the loop electric conductor 25B and the loop electric conductors 25D and 25F define the inductance element L4. The first layer 23A including the terminal electrodes 26A and 26B is disposed as the last layer.

The terminal electrode 26A is connected to one end of the connection electrode 31A and is connected to the loop electric conductor 25A of the element L1, through the interlayer electric conductors 213A to 211A and the in-plane electric conductor 210A. The terminal electrode 26B is connected to one end of the connection electrode 31B and is connected to the loop electric conductor 25B of the element L2, through the interlayer electric conductors 213B to 211B and the in-plane electric conductor 210B. The loop electric conductors 25A and 25B are connected to the input/output terminals of the wireless IC chip 21 at the connection portions P1 and P2 through the wiring electric conductors 24A to 24D and the interlayer electric conductors. One end of the loop electric conductors 25C to 25F of the elements L3 and L4 is connected to the loop electric conductors 25A and 25B of the elements L1 and L2 in the fourth layer 23D and the other end thereof is mutually connected at the connection portion 27 of the second layer 23B.

In the second pattern example depicted in FIG. 5, the in-plane electric conductor 210C is pulled out from a position located within the loop electric conductor 25C disposed on the third layer 23C and is connected to the terminal electrode 26A through the interlayer electric conductors 211C and 212C. Similarly, the in-plane electric conductor 210D is pulled out from a position located within the loop electric conductor 25D on the third layer 23C and is connected to the terminal electrode 26B through the interlayer electric conductors 211D and 212D. In this manner, in the second pattern example, the inductance elements L1 and L2 are provided by further using the portions of the loop electric conductors 25C and 25D, and the other structures are basically same as those of the first pattern example.

In the third pattern example depicted in FIG. 6, the in-plane electric conductors 210E and 210F are pulled out from positions located within the loop electric conductors 25E and 25F disposed on the second layer 23B and are connected to the terminal electrodes 26A and 26B through the interlayer electric conductors 211E and 211F. In this manner, in the third pattern example, the inductance elements L1 and L2 are provided by further using the portions of the loop electric conductors 25E and 25F, and the other configurations are basically same as those of the second pattern example.

Figure 7A:
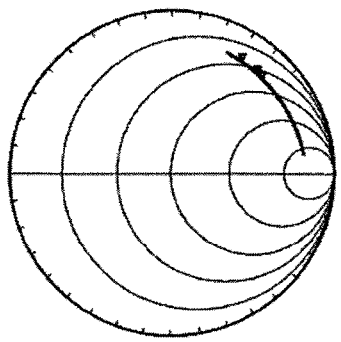
FIGS. 7A and 7B are Smith charts showing a value of impedance of each pattern.
Figure 7B:
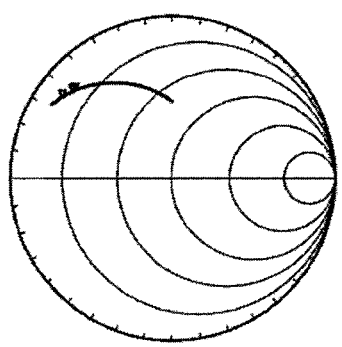
Figure 8A:
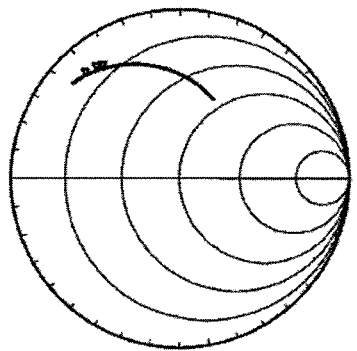
FIGS. 8A and 8B are Smith charts showing a value of impedance of each pattern.
Figure 8B:
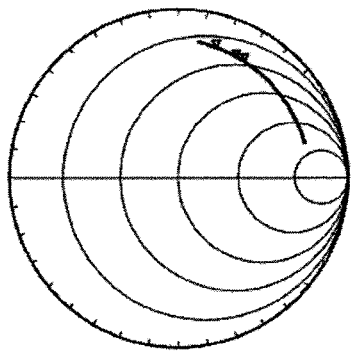

In the first, the second, and the third pattern examples, the loop electric conductors connected to the terminal electrodes 26A and 26B are most distant from the wireless IC chip 21 in the first pattern example, and the impedance property acquired between the connection portions P3 and P4 is as depicted in FIG. 7A. In this case, the elements L1 and L2 are set to each have the value of about 4 nH and the elements L3 and L4 are set to each have the value of about 15 nH, for example. The loop electric conductors connected to the terminal electrodes 26A and 26B are closest to the wireless IC chip 21 in the third pattern example, and the impedance property acquired between the connection portions 31A and 31B is as depicted in FIG. 7B. In this case, the elements L1 and L2 are set to each have the value of about 15 nH and the elements L3 and L4 are set to each have the value of about 4 nH, for example. In the second pattern example, the loop electric conductors connected to the terminal electrodes 26A and 26B are located in the middle of those of the first and the second pattern examples, and the impedance property acquired between the connection portions P3 and P4 is as depicted in FIGS. 8A and 8B. In this case, the elements L1 and L2 are set to each have the value of about 9 nH and the elements L3 and L4 are set to each have the value of about 10 nH, for example. The impedance of the wireless IC chip 21 (between the connection portions P1 and P2) is equal in all the pattern examples and does not vary.

Figure 9:
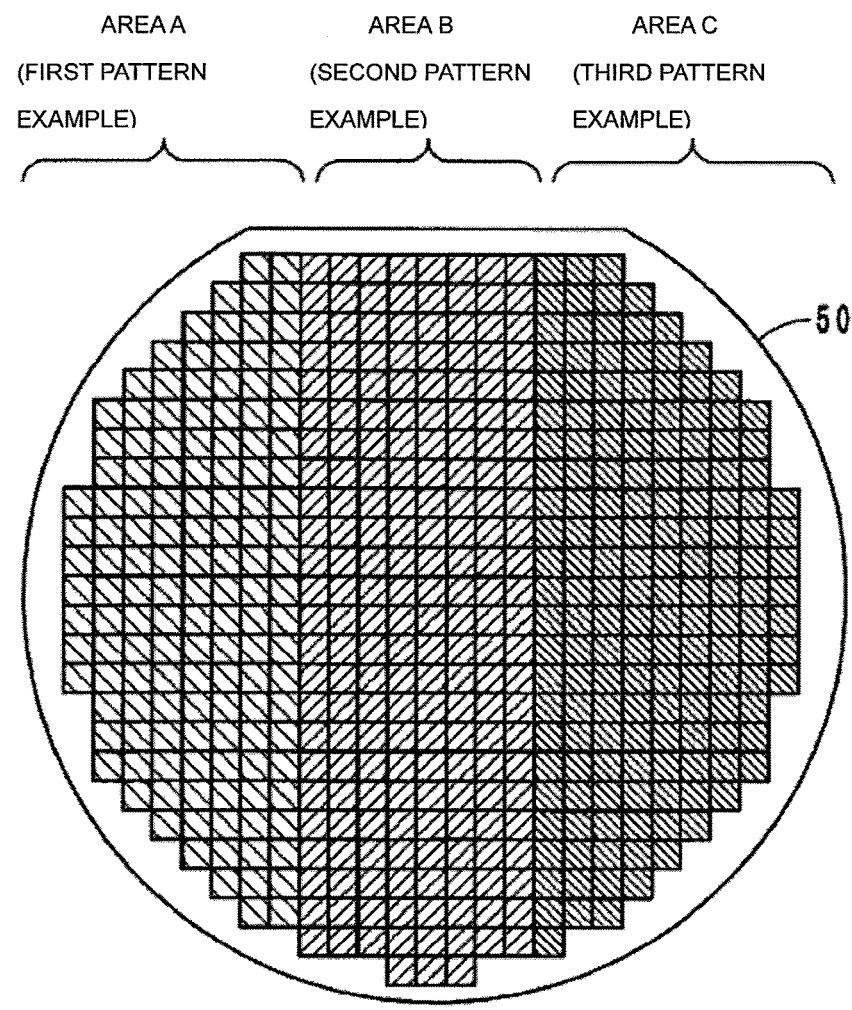
FIG. 9 is a view for explaining a pattern formed in one wafer.

As depicted in FIG. 9, the rewiring layer 22 is disposed on one wafer 50. The wafer 50 has in advance the wireless IC chips disposed thereon in a matrix, and the rewiring layer 22 is disposed on the surface (the active layer surface) thereof using, for example, the thin film micro-fabrication process. In this case, the first pattern example is disposed in an area A, the second pattern example is disposed in an area B, and the third pattern example is disposed in an area C. In this manner, the rewiring layer 22 is able to be acquired that is homogeneous in all the areas (one lot), by disposing the first, the second, and the third pattern examples in each of the areas A, B, and C.

In the manufacturing of diversified products in small quantities, the rewiring layer is disposed in each area having the variation of the electric conductor density different from that of each other in one wafer while this causes warpage and undulation in the wafer. In this preferred embodiment, the multi-layer coil electric conductors having the basically same structure are disposed on the one wafer 50 and, therefore, even with the first, the second, and the third pattern examples whose connection positions are different from each other, the rewiring layers 22 have an equal or substantially equal electric conductor density and the wafer 50 tends to avoid any warpage and undulation. The wireless communication module 20 is therefore able to be efficiently manufactured.

Figure 10:
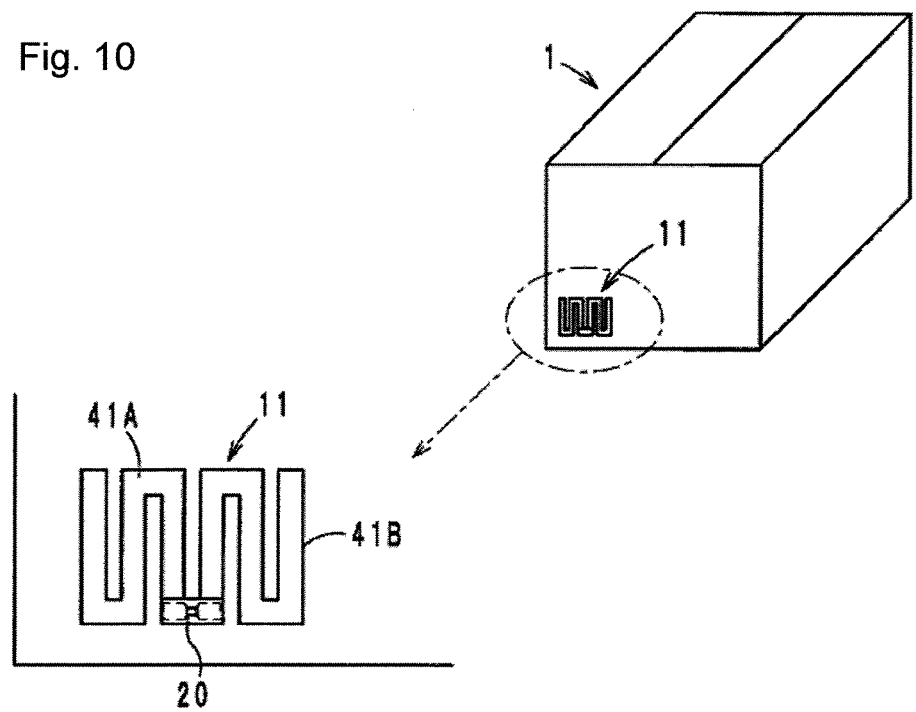
FIG. 10 are a perspective view of an article and an enlarged view of a portion of the article.
Figure 11A:
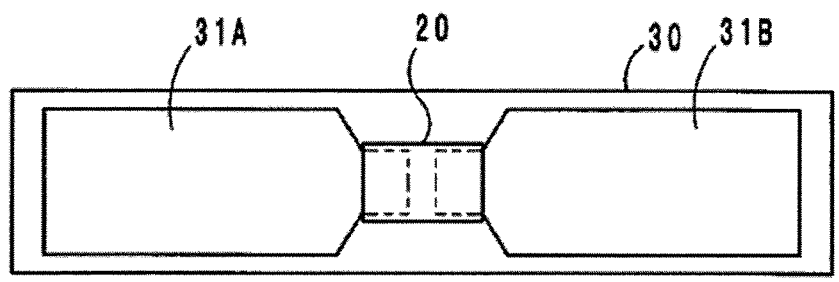
FIG. 11A is a plan view of a wireless communication device according to a first preferred embodiment of the present invention.
Figure 11B:
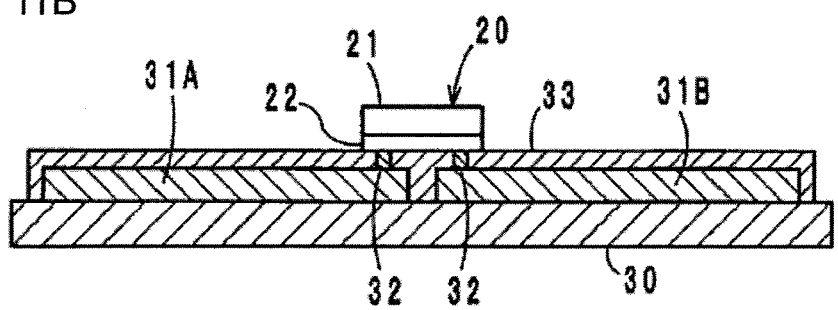
FIG. 11B is a cross-sectional view of a wireless communication device according to a first preferred embodiment of the present invention.

A wireless communication device using the wireless communication module 20 will be described. A packaging box 1 depicted in FIG. 10 preferably is made of corrugated cardboard and has the wireless communication device 11 disposed in a portion of the surface thereof, a portion at the lower left on the front surface thereof in FIG. 10. As depicted in FIG. 11A and FIG. 11B, the wireless communication device 11 includes the wireless communication module 20, a flexible substrate including the pair of connection electrodes 31A and 31B (hereinafter, described as "carrier film 30"), and radiation electric conductors 41A and 41B (see FIG. 10), and defines and functions as an RFID tag for the UHF band.

The wireless communication module 20 includes the wireless IC chip 21 that includes the rewiring layer 22, and is mounted on the carrier film 30. The pair of connection electrodes 31A and 31B each have a substantially belt shape, one end of each thereof is connected to the impedance matching circuit (a power supply circuit) 29 (at the connection portions P3 and P4), and the other end of each thereof is an open end. The radiation electric conductors 41A and 41B are directly patterned on the surface of the packaging box 1, and the carrier film 30 is attached thereon. For example, the one end of each of the radiation electric conductors 41A and 41B is connected to the corresponding one of the open ends of the connection electrodes 31A and 31B, and the wireless communication module 20 defines and functions as a dipole antenna that transmits and receives wireless signals at a communication frequency that corresponds to the resonance frequency of the impedance matching circuit 29.

The connection relation between the connection electrodes 31A and 31B, and the radiation electric conductors 41A and 41B may be any one of direct electric connection, connection through capacitance, connection through a magnetic field, and connection through an electromagnetic field.

Figure 12:
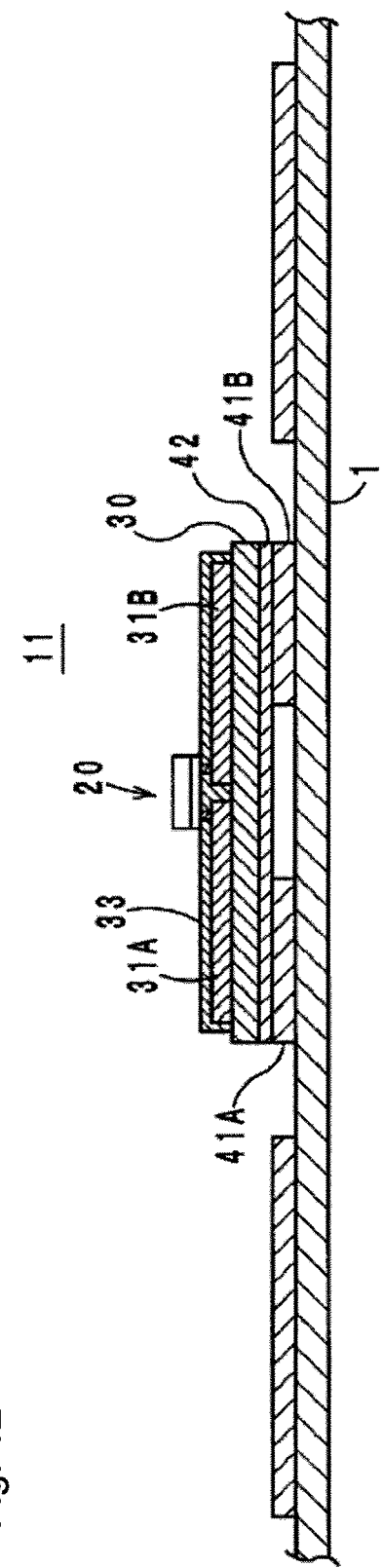
FIG. 12 is a cross-sectional view of a mounting form of the wireless communication device according to the first preferred embodiment of the present invention on the article.

As depicted in FIG. 11B, the wireless communication module 20 is connected to an end of each of the connection electrodes 31A and 31B on the carrier film 30 through solder 32, and is covered with a resist layer 33 including the solder 32 on the connection electrodes 31A and 31B, and the wireless communication device 11 as the first preferred embodiment is thus provided. As depicted in FIG. 12, for the wireless communication device 11, the carrier film 30 is attached to one end of each of the radiation electric conductors 41A and 41B patterned on the surface of the packaging box 1, through an adhesive layer 42.

The connection electrodes 31A and 31B, and the radiation electric conductors 41A and 41B are therefore capacitance-coupled through the adhesive layer 42 and the carrier film 30. A high frequency signal (for example, a UHF frequency band) radiated from a reader/writer not depicted is received by the radiation electric conductors 41A and 41B, resonates the power supply circuit 29 through the connection electrodes 31A and 31B that are capacitance-coupled with the radiation electric conductors 41A and 41B, and supplies only the received signal in a predetermined frequency band to the wireless IC chip 21. The radiation electric conductor 41A, the inductance element L3, the inductance element L4, the connection electrode 31B, and the radiation electric conductor 41B define an antenna having the electric length of about λ/2. The signal current flowing through this antenna is supplied to the wireless IC chip 21 through the impedance matching circuit 29 defined by the loop portion defined by the inductance elements L1, L2, L3, and L4. On the other hand, the wireless IC chip 21 takes out predetermined energy from the received signal, matches the stored information with a predetermined frequency using the impedance matching circuit 29 using the energy as a driving source, delivers a transmission signal to the radiation electric conductors 41A and 41B through the connection electrodes 31A and 31B, and transmits the transmission signal from the radiation electric conductors 41A and 41B to the reader/writer.

In the wireless communication device 11, the impedance matching circuit 29 is disposed in the rewiring layer 22 of the wireless IC chip 21 to configure the wireless communication module 20, this module 20 is mounted on the carrier film 30 that includes the connection electrodes 31A and 31B, and this film 30 is attached to an article (the packaging box 1) that includes the radiation electric conductors 41A and 41B. The module 20 is very small because the power supply circuit 29 is disposed in the rewiring layer 22 whose area is equal or substantially equal to that of the wireless IC chip 21. This small module 20 is coupled with the connection electrodes 31A and 31B disposed on the carrier film 30 that is somewhat larger than the module 20. The carrier film 30 including the connection electrodes 31A and 31B is attached to the article including the radiation electric conductors 41A and 41B that are larger than the connection electrodes 31A and 31B. Therefore, the module 20 is able to be precisely and easily mounted relative to the connection electrodes 31A and 31B, and the connection electrodes 31A and 31B are able to be precisely and easily mounted relative to the radiation electric conductors 41A and 41B. Especially, compared to the devices used for an HF band, in the wireless communication device 11 used for the UHF band, the wireless IC chip 21 needs to highly precisely be mounted relative to the radiation electric conductors 41A and 41B. As above, this wireless communication device 11 enables highly precise mounting thereon of the wireless IC chip 21.

Because the impedance matching circuit 29 significantly influencing the communication property is incorporated in the rewiring layer 22 (having a micro area) of the wireless IC chip 21, the rewiring layer 22 is not influenced by the shape of the surface of the article to which this wireless communication device 11 is attached, and the relative permittivity of the article, and the like. The frequency of the impedance matching circuit 29 therefore avoids any possibility of variation.

Figure 15A:
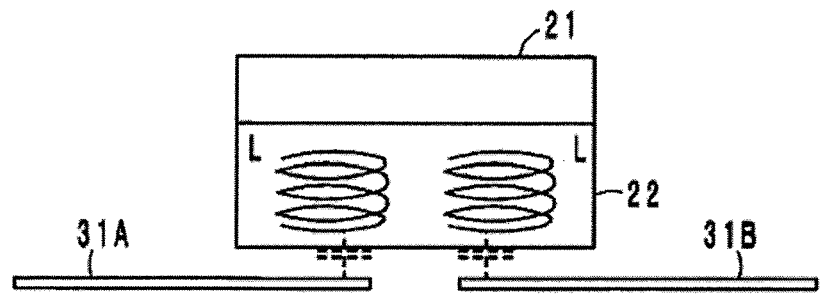
FIG. 15A is a view for explaining an action of inductance elements disposed on a rewiring layer of an example.
Figure 15B:
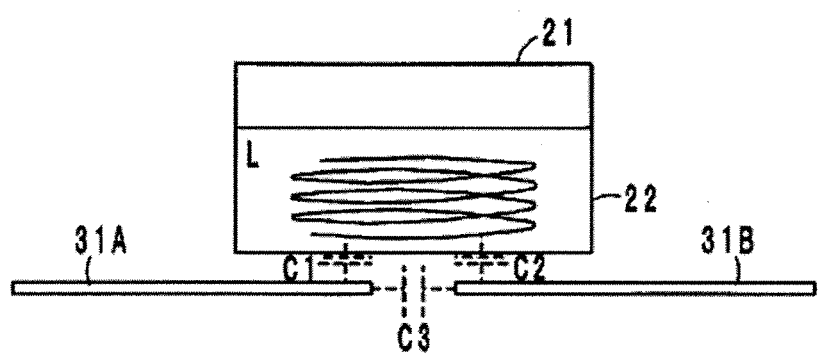
FIG. 15B is a view for explaining an action of inductance elements disposed on a rewiring layer of Comparative Example.

Structural features of the inductance elements disposed in the rewiring layer 22 will be described. FIG. 15A and FIG. 15B of schematically depict the coil inductance elements L inside the rewiring layer 22. When the inductance elements L are disposed extending over the two connection electrodes 31A and 31B as in Comparative Example depicted in FIG. 15B, capacitance C3 is also formed between the connection electrodes 31A and 31B in addition to pieces of capacitance C1 and C2 that are originally necessary. Because the radiation electric conductors 41A and 41B define and function as an antenna utilizing a potential difference between both open ends, the amount of the electric field radiated into the air is reduced when the capacitance C3 is generated.

In contrast, in this preferred embodiment, as depicted in FIG. 15A, the inductance elements L are disposed adjacent to each other in a plan view and do not extend over the two connection electrodes 31A and 31B. Substantially no capacitance C3 is thus generated between the connection electrodes 31A and 31B, and any reduction of the amount of the electric field radiated into the air is able to be prevented.

As depicted in FIG. 4, FIG. 5, and FIG. 6, the terminal electrodes 26A and 26B connected respectively to the inductance elements L1 and L3, and L2 and L4 are disposed to each have a narrow width not to substantially cover coil openings of the inductance elements L1 to L4 and the pulling out portion (the interlayer electric conductor 28) is disposed on the inner side of the coils. A large area to dispose the coil pattern therein is necessary to dispose a coil pattern having a high L-value and a high Q-value while the rewiring layer 22 is very small. Disposing the coil patterns each having as large an area as possible in the rewiring layer 22 having the small area is enabled by disposing the pulling out portions to the connection electrodes 31A and 31B in areas inside the coils. Preferably, the terminal electrodes 26A and 26B are disposed not to overlap all the coil openings (inner diameter areas) of the inductance elements L1 to L4 while the terminal electrodes 26A and 26B only have to be disposed not to overlap with at least the coil central axis of each of the inductance elements L1 to L4.

In the rewiring layer 22, the inductance elements L1 to L4 are disposed on the second layer 23B, the third layer 23C, and the fourth layer 23D with the fifth layer 23E and the sixth layer 23F disposed being sandwiched therebetween. The inductance elements L1 to L4 are positioned as far as possible from the active layer surface of the wireless IC chip 21 using the presence of the fifth layer 23E and the sixth layer 23F, and reduction of the Q-value of each of the coils is thus able to be prevented. Preferably, the coil pattern configuring the inductance elements L1 to L4 is offset-disposed at a position somewhat shifted toward the mounting face.

Articles that are able to have the wireless communication device 11 mounted thereon may be widely selected from those such as electric appliances such as a personal computer, various types of measuring apparatus, and the like, household articles such as a table, a chair, and the like, and public articles such as a street lamp, a telephone pole, and the like, in addition to the packaging box 1 like a corrugated cardboard box. The packaging box 1 may be a paper sheet label or a seal. For the packaging box 1, a pattern printed on the surface of the box using Ag or the like is usable as the radiation electric conductors 41A and 41B. An antenna pattern or the like formed by patterning an aluminum foil sheet or a copper foil sheet into a predetermined shape on a film such as a PET film is surely usable as the radiation electric conductors 41A and 41B.

A heat-resistant film such as, for example, a polyimide film is usable as the carrier film 30. Electrodes formed by patterning an aluminum foil sheet or a copper foil sheet laminated on a film into a predetermined shape are usable as the connection electrodes 31A and 31B. Any materials or methods other than the solder 32 may be used to mount the wireless communication module 20 on the connection electrodes 31A and 31B. For example, Ag nano-bonding or ultrasonic bonding may be used for the mounting. The adhesive layer 42 to bond the carrier film 30 to the radiation electric conductors 41A and 41B may be any ordinarily insulating adhesive, or an insulating double-sided tape may be used for the bonding.

Figure 13:
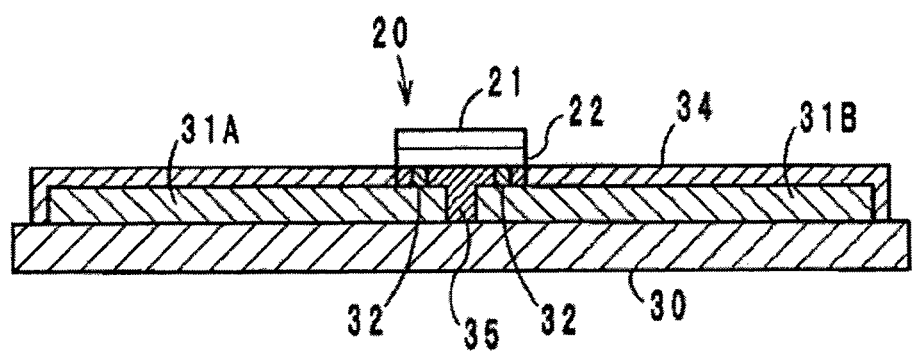
FIG. 13 is a cross-sectional view of a wireless communication device according to a second preferred embodiment of the present invention.

A wireless communication device 12 according to a second preferred embodiment of the present invention will be described. The wireless communication device 12 uses the wireless IC chip 21 that includes the rewiring layer 22 described in the first preferred embodiment and, as depicted in FIG. 13, the connection portions P3 and P4 of the rewiring layer 22 (see FIG. 2) are connected to the connection electrodes 31A and 31B through the solder 32, a conductive bonding material 34 is disposed on the connection electrodes 31A and 31B, and an under-fill 35 is disposed immediately beneath the rewiring layer 22. The other configurations are same as those of the first preferred embodiment.

Figure 14:
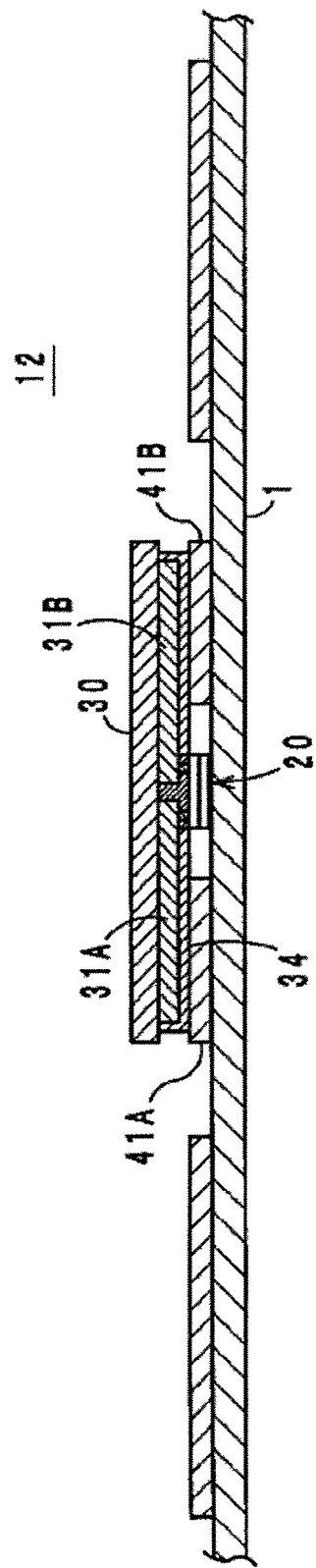
FIG. 14 is a cross-sectional view of a mounting form of the wireless communication device according to the second preferred embodiment of the present invention on the article.

As depicted in FIG. 14, in the wireless communication device 12, the conductive bonding material 34 is bonded to the radiation electric conductors 41A and 41B with the wireless communication module 20 facing the radiation electric conductors 41A and 41B. In this second preferred embodiment, the connection electrodes 31A and 31B, and the radiation electric conductors 41A and 41B are directly connected electrically to each other through the conductive bonding material 34. The state of the communication with the reader/writer of the wireless communication device is basically same as that described in the first preferred embodiment, and the action and the effect thereof are also same as those of the first preferred embodiment. Especially, in the second preferred embodiment, the carrier film 30 is attached to the radiation electric conductors 41A and 41B for the carrier film 30 to be attached on the outer side and the protection performance for the wireless communication module 20 is therefore improved.

The rewiring layer 22 disposed in the wireless communication module 20 is in contact with the article through the wireless IC chip 21. The rewiring layer 22 therefore tends to avoid any influence of the floating capacitance by the article and the inductance value of the rewiring layer 22 tends to avoid any influence of metal portions of the article.

Any conductive adhesive or any conductive tape is usable as the conductive bonding material 34.

Other Preferred Embodiments

The wireless communication devices and the manufacturing methods of the wireless communication module according to the present invention are not limited to those of the above preferred embodiments and may variously be changed within the gist of the present invention.

For example, the structure of each of the details of the rewiring layer, the shapes of the connection electrode and the radiation electric conductor, and the like are arbitrary. Especially, the shape of the radiation electric conductor is not limited to the meander shape presented in the preferred embodiments.

Figure 16:
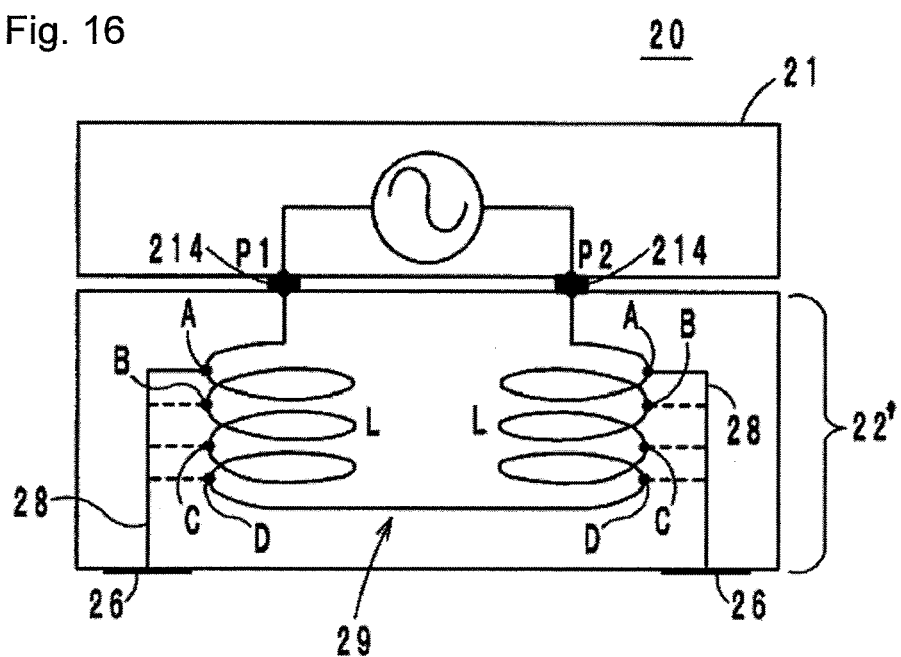
FIG. 16 is a schematic view of another exemplary configuration of the wireless communication device depicting an example that uses a multi-layer substrate.

The wireless communication module 20 is not limited to the one formed by disposing the impedance matching circuit 29 in the rewiring layer 22 disposed on the principal surface of the wireless IC chip 21 and, for example, as depicted in FIG. 16, a wireless communication module may be formed by incorporating the impedance matching circuit 29 in a multi-layer substrate 22' formed by stacking plural base material layers (for example, insulator layers including resin layers or ceramic layers) and the wireless IC chip 21 is mounted on the multi-layer substrate 22' through a conductive bonding material 214 such as solder.

Various preferred embodiments of the present invention are useful for a wireless communication device used in an RFID system and, especially, are excellent in that diversified wireless communication devices are able to be efficiently be acquired and have impedance values that are different from each other and that can cope with various types of antennas.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wireless communication device comprising:
   a wireless communication module including a wireless IC chip including first and second input/output terminals and processing an RF signal of a UHF band, and an impedance matching circuit connected to the first and the second input/output terminals; and
   an antenna base material having the wireless communication module mounted thereon and including an antenna element disposed thereon; wherein
   the impedance matching circuit includes:
   a first multi-layer coil electric conductor including one end connected to the first input/output terminal and including a plurality of loop electric conductors provided in a plurality of layers; and
   a second multi-layer coil electric conductor including one end connected to another end of the first multi-layer coil electric conductor and another end connected to the second input/output terminal and including a plurality of loop electric conductors provided in a plurality of layers; wherein
   a surface of the wireless communication module includes a first terminal electrode disposed thereon that is connected to any one of the plurality of loop electric conductors of the first multi-layer coil electric conductor through a first in-plane electric conductor and a first interlayer electric conductor, and a second terminal electrode disposed thereon that is connected to any one of the plurality of loop electric conductors of the second multi-layer coil electric conductor through a second in-plane electric conductor and a second interlayer electric conductor; and
   an impedance of the antenna element for the first and the second input/output terminals of the wireless IC chip is determined by a connection position of the first in-plane electric conductor to the first multi-layer coil electric conductor and a connection position of the second in-plane electric conductor to the second multi-layer coil electric conductor.

2. The wireless communication device according to claim 1, wherein in each of the first and the second multi-layer coil electric conductors, the plurality of loop conductors each adjacent to each other in a stacking direction have a same winding axis and a same outer diameter dimension.

3. The wireless communication device according to claim 1, wherein the first and the second terminal electrodes are disposed to avoid substantially covering coil openings of the first and the second multi-layer coil electric conductors.

4. The wireless communication device according to claim 1, wherein the impedance matching circuit is disposed in a rewiring layer disposed on a principal surface of the wireless IC chip.

5. The wireless communication device according to claim 1, wherein
   a pair of radiation electric conductors is capable of being connected to the impedance matching circuit;
   the impedance matching circuit, the wireless IC chip and the pair of radiation electric conductors define a dual resonance circuit that resonates at a plurality of frequencies different from each other.

* * * * *